United States Patent [19]

Scheer

[11] Patent Number: 5,440,449

[45] Date of Patent: Aug. 8, 1995

[54] WIRELESS COMMUNICATION CONNECTOR AND MODULE FOR NOTEBOOK PERSONAL COMPUTERS

[75] Inventor: David C. Scheer, Pollock Pines, Calif.

[73] Assignee: Intel Corporation, Santa Clara, Calif.

[21] Appl. No.: 188,139

[22] Filed: Jan. 26, 1994

[51] Int. Cl.6 .......................... G06F 1/16; H05K 7/10
[52] U.S. Cl. ...................................... 361/686; 361/730
[58] Field of Search ................ 364/708.1; 439/928;
361/681–684, 686, 728–730, 724–727

[56] References Cited

U.S. PATENT DOCUMENTS 4,926,365 5/1990 Hsieh ..................... 364/708.1
5,020,090 5/1991 Morris ...................... 379/58
5,058,045 10/1991 Ma ........................... 361/683

Primary Examiner—Michael W. Phillips
Attorney, Agent, or Firm—Owen L. Lamb

[57] ABSTRACT

A notebook personal computer (PC) in which an I/O connector and module are located at the top of the display screen. The module is L-shaped to conform to the shape of the display screen housing with the connector to the internal printed circuit input/output (I/O) card extending into the notebook PC frame. The connector is constructed so as to mate with I/O cards which are fitted with a standard I/O card contact design.

11 Claims, 3 Drawing Sheets

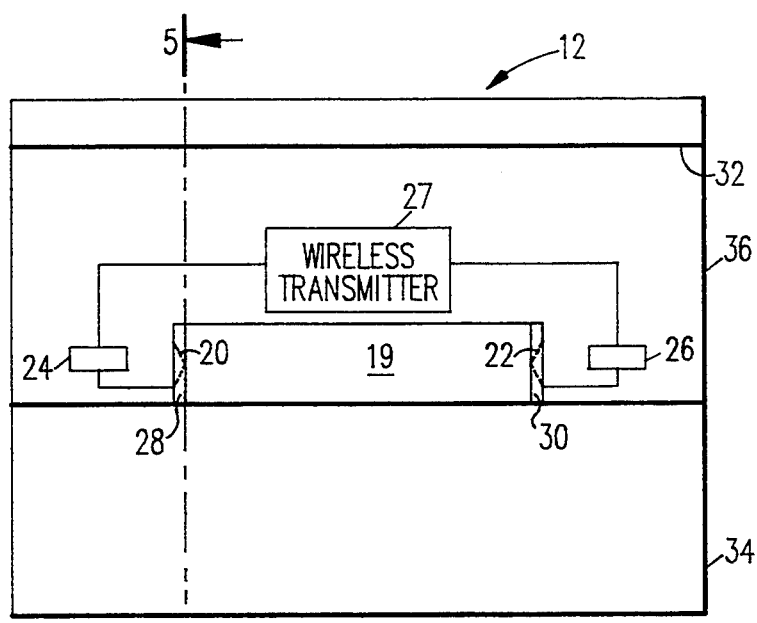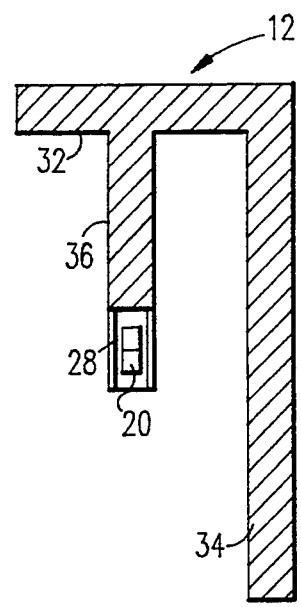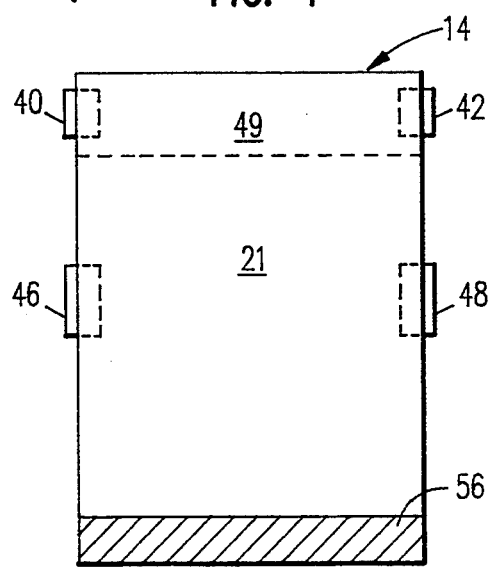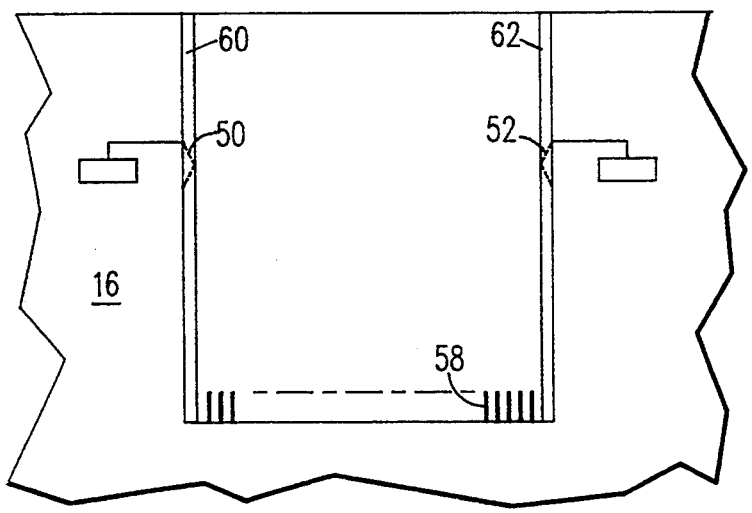

WIRELESS COMMUNICATION CONNECTOR AND MODULE FOR NOTEBOOK PERSONAL COMPUTERS

BACKGROUND OF THE INVENTION

1. Field of the Invention The present invention is related to personal computers and more specifically to an apparatus for data communication between portable computers and various types of communication facilities.

2. Prior Art

A notebook computer is a small, lightweight, portable, battery-powered, lap-top personal computer (PC) that uses a thin, lightweight, display screen such as a liquid crystal display (LCD). Notebook PCs typically run several hours on rechargeable batteries, weigh 4–7 pounds, fold up, and can be carried like a briefcase.

Personal computers need to interface with various types of communication facilities. A line adapter is a device that performs the modulation/demodulation and associated control functions necessary to provide compatibility between personal computers and the communication facilities. For example a modem (MOdulator/DEModulator) is a line adapter that converts digital computer signals to analog signals compatible with a telephone system. People use modems attached to a notebook PC to exchange information with other computers such as large main frame computers hosting on-line information services or a desktop PC located in an office. Some notebook PCs use a cordless pointing device such as a battery-powered pen that is used to select operating menus and to sketch on the display screen. Communication with these types of devices is necessary.

An international standard has been promulgated by the Personal Computer Memory Card International Association (PCMCIA). The PCMCIA standard defines the electrical and physical interface specifications for memory and input/output (I/O) cards (officially known as PC cards) that allows different I/O devices (Modems, mass storage, and other peripherals) to be attached and removed interchangeably in the same PCMCIA standard socket.

Wireless communication devices use radio frequency (RF) or infrared (IR) transceivers. Currently wireless communication for PCMCIA printed circuit cards inside a notebook PC is via an external line adapter module. The module is attached to the notebook PC in a number of ways. Alternatively, the communication device is permanently built into the notebook PC. There is currently no flexible mechanism that allows connection of a number of different wireless communication devices through one connection scheme. Because of the small size of a notebook PC a large number of different connection points on the carrying case is not feasible.

It is therefore an object of this invention to provide a method and means for providing an adaptable connection for wireless communication devices such as radio frequency (RF) or infrared (IR) transceivers.

SUMMARY OF THE INVENTION

Briefly, the above object is accomplished in accordance with the invention by providing an I/O connector and module located at the top of a display screen of a notebook PC. The module is L-shaped to conform to the shape of the notebook PC frame housing. A connector to an internal printed circuit input/output (I/O) card extends into the notebook PC frame. The connector is constructed so as to mate with I/O cards which are fitted with standard I/O card contacts.

An advantage of this invention is that system manufacturers can integrate components such as RF antennae or IR transceivers on a notebook PC.

A further advantage of this invention is that it eliminates the need for line adapter modules for wireless applications. The user can replace one wireless communication module with another type of wireless communication module depending upon the type of communication desired. For example a pointing device may be replaced with a fax/modem so that a printed page can be transmitted between the notebook PC and a remote location via telecommunications.

A further advantage of the invention is that the location of the module at the top of the display screen results in maximum utility (less chance of obstruction) in infra-red (IR) communication applications since IR uses a direct line of sight for light transmission.

A further advantage of this invention is that the reliability of the notebook PC is increased because many different external connectors for each specific application are eliminated.

A further advantage of this invention is that it allows complete system integration of components.

A further advantage of this invention is that user has less accessory items to carry along with the notebook PC.

The foregoing and other objects, features, and advantages of the invention will be apparent from the following more particular description of a preferred embodiment of the invention as illustrated in the accompanying drawings.

BRIEF DESCRIPTION OF THE DRAWINGS

FIG. I is a diagram of a notebook personal computer in which the present invention is embodied;

FIG. 4 is a diagram of another embodiment of a connector module constructed in accordance with the present invention;

FIG. 5 is a sectional view along lines 5—5 of the module shown in FIG. 4;

FIG. 6 is a diagram of a printed circuit card for insertion in a printed circuit board;

FIG. 7 is a diagram of a printed circuit board within a notebook personal computer;

DESCRIPTION OF THE PREFERRED EMBODIMENT

Figure 1:
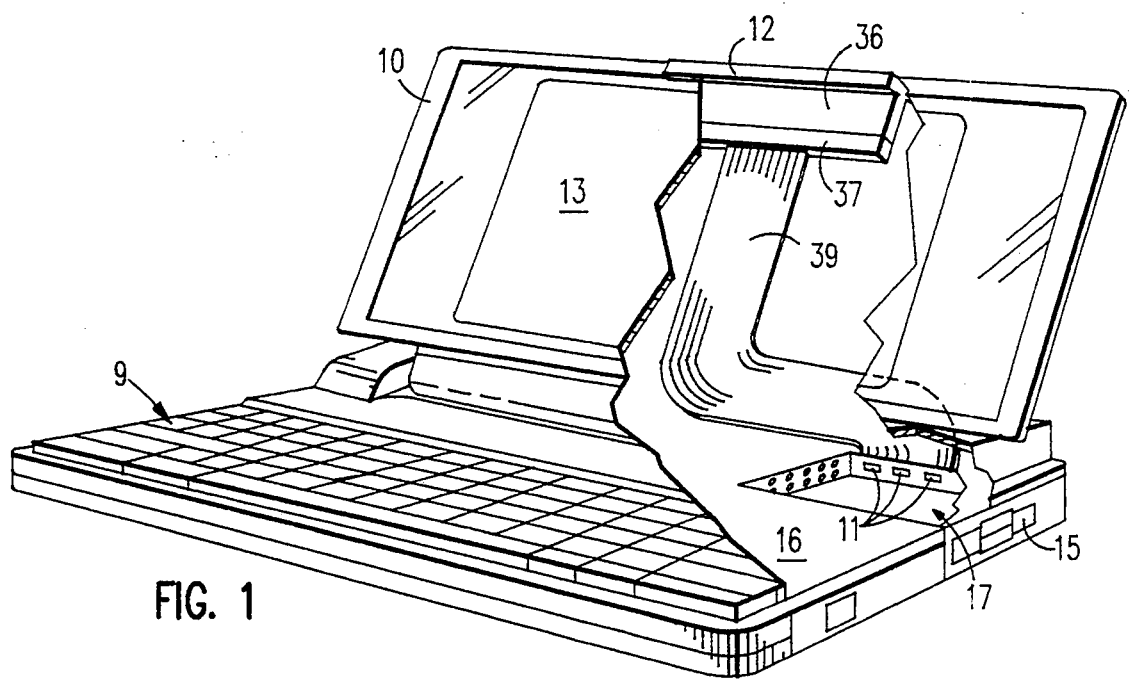

FIG. 1 is a diagram of a notebook personal computer (10) in which the present invention is embodied. A connector module (12) is located at the top of a display screen (13) which is hinged to a keyboard (9). The module is L-shaped to conform to the shape of the notebook PC frame housing with a projection (36) extending into the notebook PC frame. The projection (36) has a 14-pin connector that mates with a 14-pin socket (37). The 14-pin socket is connected via a cable (39) to a PCMCIA standard socket (15)in a printed circuit board (16) that is in the same plane as the keyboard (9). The cable (39) is wired to Intel SideSwipe ™ contacts (11) in the socket (15) constructed so as to mate with I/O cards which are fitted with the Intel SideSwipe ™ contact design.

Connector Module

A radio frequency (RF) module consists of an antenna for 800 MHz transmission housed in the module (12). The radio itself is housed in a PCMCIA PC card that is inserted in the slot (17).

Figure 2:
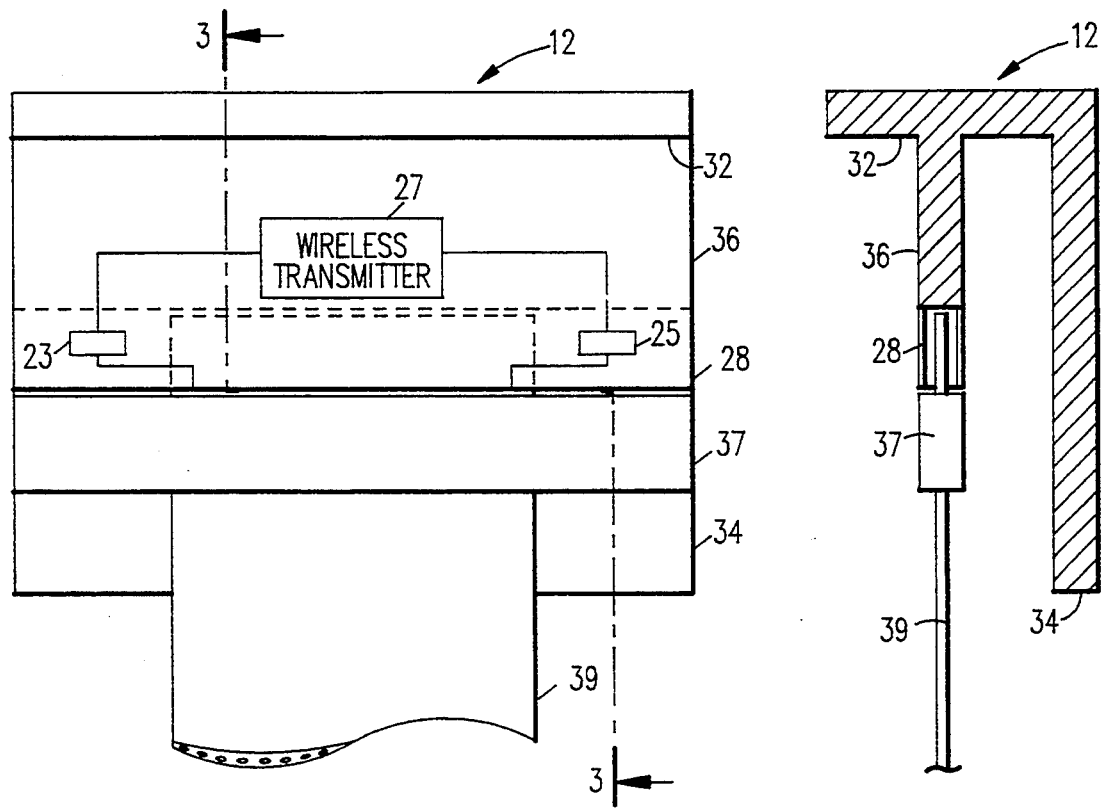
FIG. 2 is a diagram of a preferred embodiment of a connector module constructed in accordance with the present invention.

An infrared (IR) module consists of light emitting diodes (LEDs) and LED circuitry housed in the module (12). A PCMCIA card that is inserted in the slot (17) houses a digital interface to the IR module. Refer to FIG. 2 which is a diagram of the connector module (12) shown in FIG. 1. The connector module is constructed with 14 contact points that mate with and make electrical connection with a 14-pin card socket (37). The contact points are connected to internal pads (23, 25) on the connector module. The internal pads may be connected to an internal circuit, such as, for example, an RF antenna or IR transmitter (27) that provides wireless communication with external devices.

Figure 3:
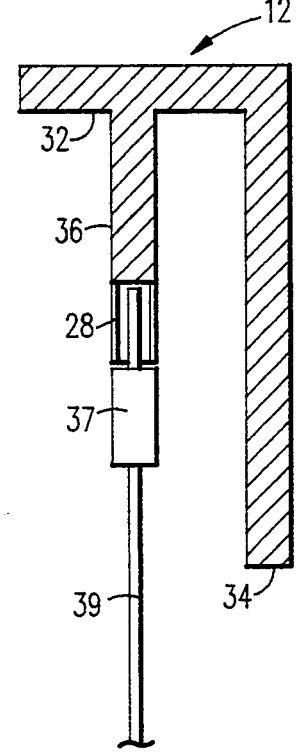
FIG. 3 is a sectional view along lines 3—3 of the module shown in FIG. 2.

FIG. 3 is a sectional view along lines 3—3 of the module shown in FIG. 2. The connector module includes a module slot for receiving a compatible socket (37). Rails 28,30 form the module slot and provide grooves that grip the sides of the socket to hold the module in place when mated with the socket. The module (12) is L-shaped to conform to the outside of the frame of the notebook PC. An upper leg (32) extends along the top of the PC display frame and the back leg (34) extends along the back of the PC display frame. A projection (36) projects into the PC frame and mates with the socket (37) within the PC. The socket is wired to a cable (39).

Refer to FIG. 4 which is a diagram of another embodiment of the connector module (12) shown in FIG. 1. In this embodiment the module mates with a printed circuit board in the same plane as the display screen. The connector module is constructed with contact points (20, 22) that mate with and make electrical connection to compatible SideSwipe ™ contacts on the side of a PC card corresponding to an extended portion of the card. The contact points are connected to internal pads (24, 26) on the connector module. The internal pads may be connected to an internal circuit, such as, for example, an RF antenna or IR transmitter that provides wireless communication with external devices. Alternatively, the card is fitted with a 14-pin connector.

The connector module includes a module slot (19) for receiving a compatible printed circuit card. Rails (28, 30) within the module slot (19) provide a groove that grips the sides of the printed circuit card to hold the module in place when mated with the printed circuit card.

FIG. 5 is a sectional view along lines 5—5 of the module shown in FIG. 4 The module (12) is L-shaped to conform to the outside of the frame of the notebook PC. An upper leg (32) extends along the top of the PC display frame and the back leg (34) extends along the back of the PC display frame. A projection (36) projects into the PC frame and mates with a printed circuit card within the PC.

Printed Circuit Card

Refer to FIG. 6 which is a diagram of a PC card. The PC card conforms to the extensions to the PCMCIA standards in which the standard dimensions of the card remain the same except for an extended substrate area portion (49) that extends 10 mm past the standard card length of 85.6 mm. SideSwipe ™ contacts (40, 42) are provided on the side of the card corresponding to the extended substrate area of the card and are positioned to make contact with the contact points (20, 22) on the module (12) shown in FIG. 4. SideSwipe ™ contacts (46, 48) are provided on the side of the card corresponding to a main substrate area (21) of the card and are positioned to make contact with the contact points on a board. An interconnect area (56) of the card mates with connector pins on a printed circuit board inside the PC. Alternatively, the edge opposite the interconnect area is a 14-pin connector.

When a card is inserted into a card slot in a board, connector pins on the board (58) mate with a compatible interconnect area (56) on the card, and SideSwipe ™ contacts (40, 42) on the side of the card corresponding to the extended portion of the card mate with SideSwipe ™ contact points (20, 22) on the connector module shown in FIG. 4.

Printed Circuit Board

Refer to FIG. 7 which is a diagram of an printed circuit board (16) within the notebook personal computer shown in FIG. 1. The printed circuit board (16) is secured to the display frame of the computer and is permanent part of the computer. The printed circuit board includes is a card slot (17) in the board, for receiving a compatible printed circuit card. The card slot (17) has rails (60, 62), connector pins (58), and SideSwipe ™ type contact points (50, 52) for mating with compatible contacts (46, 48) on a printed circuit card inserted in the card slot. When a card is inserted into the card slot (17), connector pins (58) on the board mate with a compatible connector (56) on the card, and contact points (50, 52) on the board mate with SideSwipe ™ contacts (46, 48) on the side of the card.

Figure 8:
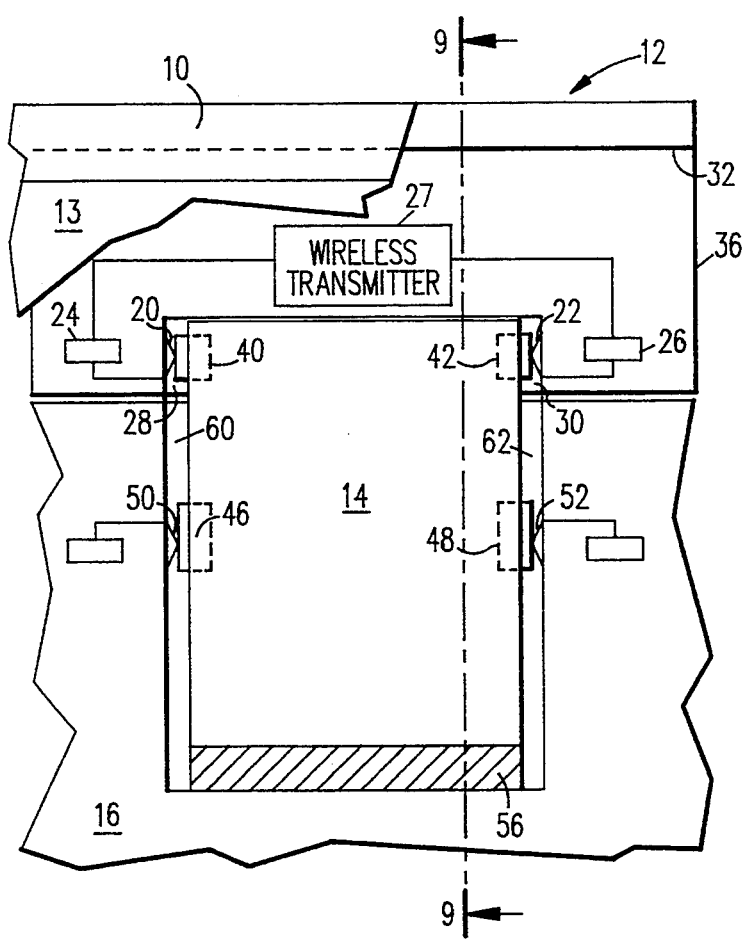
FIG. 8 is a composite diagram of the printed circuit card of FIG. 6 the printed circuit board of FIG. 7 and the connector module of FIG. 4; and, FIG. 9 is a sectional view along lines 9—9 of the composite diagram of FIG. 8.
Figure 9:
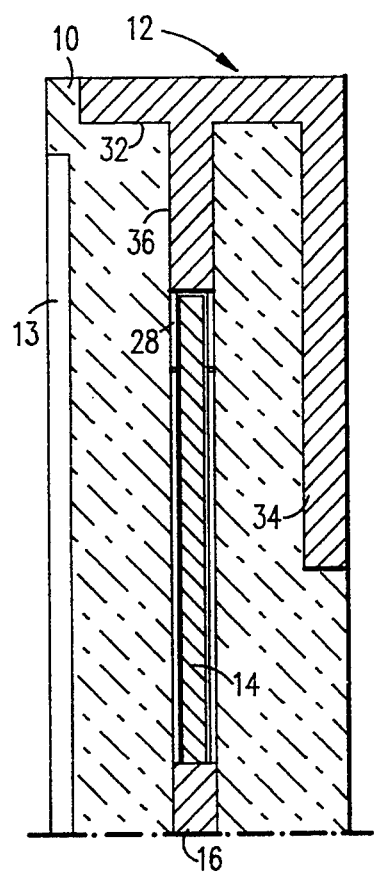

Refer to FIG. 8, which is a composite diagram of the printed circuit card, the printed circuit board and the connector module and FIG. 9, which is a sectional view along lines 8—8 of the composite diagram of FIG. 8.

As shown in FIG. 8 the card (14) fits into a card slot in the board (16) and a contact area (56) on the card mates with compatible connectors on the board (16). An extended substrate area of the card (14) extends above the board (16). The module (12) has a slot therein that fits over the extended substrate area of the card (14) and a contacts (20, 22) on the module (12) mate with compatible contacts(40, 42) on the card (14).

As shown in FIG. 9, the module (12) is L-shaped to conform to the outside of the frame (10) of the notebook PC. An upper leg (32) extends along the top of the display frame and a back leg (34) extends along the back of the display frame. A projection (36) projects into the PC frame and mates with the printed circuit card (14) within the PC.

The SideSwipe ™ contacts (40, 42) that are provided on the side of the card corresponding to the extended substrate area of the card and are positioned to make contact with the contact points (20, 22) on the module (12). The SideSwipe ™ contacts (46, 48) that are provided on the side of the card corresponding to the main substrate area of the card and are positioned to make contact with the contact points (50, 52) on the board (16). An interconnect area (56) of the card mates with connector pins on the board.

While the invention has been particularly shown and described with reference to preferred embodiments thereof, it will be understood by those skilled in the art that the foregoing and other changes in form and detail may be made therein without departing from the scope of the invention.

What is claimed is:

1. For use with a computer which includes,
   a display screen housing having a top edge, a back edge, two side edges, and a hinged edge, said hinged edge connecting said display screen housing to a body portion of said computer;
   an internal printed circuit means within said computer;
   an apparatus for interfacing with said internal printed circuit means comprising:
   module means located at said top edge of said display screen housing;
   said module being shaped to conform to said shape of said display screen housing:
   upper leg means of said module means for providing support along said top edge said display screen housing;
   a back leg means of said module means for providing support along said back edge of said display screen housing; and,
   projection means of said module means providing a projection into said display screen housing;
   said projection means being constructed so as to mate with said internal printed circuit means.

2. The apparatus in accordance with claim 1 wherein:
   said projection means includes connection means for providing electrical contact with a signal originating on said internal printed circuit means.

3. The apparatus in accordance with claim 1 wherein:
   said module has a wireless transmitter fabricated thereon.

4. The apparatus in accordance with claim 3 wherein:
   said projection means includes connection means for providing electrical contact with a signal originating on said internal printed circuit means.

5. The apparatus in accordance with claim 1 wherein:
   said internal printed circuit means is a card which includes an extended substrate area, a main substrate area, and an interconnect area;
   said interconnect area includes connectors for providing a card contact for a signal originating on said card to a board in said computer;
   said projection being constructed so as to make electrical contact with said extended substrate area of said card.

6. The apparatus in accordance with claim 4 wherein:
   said module has a wireless transmitter fabricated thereon; and,
   said projection includes connectors for providing a card contact for a signal originating on said card to said wireless transmitter.

7. For use with a computer which includes,
   a display screen housing having a top edge, a back edge, two side edges and a hinged edge for connecting said display screen housing to a body portion of said computer; and,
   an internal printed circuit card within said computer;
   an apparatus for interfacing with said internal printed circuit comprising:
   a module located at said top edge of said display screen housing;
   said module having an upper leg, a back leg, and a projection;
   said upper leg of said module extending along said top edge of said display screen housing;
   said back leg of said module extending along said back edge of said display screen housing; and,
   said projection of said module projecting into said display screen housing;
   said projection being constructed so as to make electrical contact with said internal printed circuit card.

8. The apparatus in accordance with claim 7 wherein:
   said module has a wireless transmitter fabricated thereon; and,
   said projection includes connectors for providing a card contact for a signal originating on said card to said wireless transmitter.

9. The apparatus in accordance with claim 7 wherein:
   said internal printed circuit card includes an extended substrate area, a main substrate area, and an interconnect area;
   said interconnect area includes connectors for providing a card contact for a signal originating on said card to a board in said computer;
   said projection being constructed so as to make electrical contact with said extended substrate area of said internal printed circuit card.

10. The apparatus in accordance with claim 9 wherein:
    said module has a wireless transmitter fabricated thereon; and,
    said projection includes connectors for providing a card contact for a signal originating on said card to said wireless transmitter.

11. For use with a computer which includes,
    a display screen housing having a top edge, a back edge, two side edges and a hinged edge for connecting said display screen housing to a body portion of said computer; and,
    an internal printed circuit card within said computer;
    an apparatus for interfacing with said internal printed circuit comprising:
    a module located at said top edge of said display screen housing;
    said module having a wireless transmitter fabricated therein;
    said module having an upper leg, a back leg, and a projection;
    said upper leg of said module extending along said top edge of said display screen housing;
    said back leg of said module extending along said back edge of said display screen housing;
    said projection of said module projecting into said display screen housing;
    said projection being constructed so as to make electrical contact with said internal printed circuit card;
    said projection includes connectors for providing a card contact for a signal originating on said internal printed circuit card to said wireless transmitter;
    said internal printed circuit card includes an extended substrate area, a main substrate area, and an interconnect area;
    said interconnect area including connectors for providing a card contact for a signal originating on said card to a board in said computer;
    said projection being constructed so as to make electrical contact with said extended substrate area of said internal printed circuit card.

* * * * *